US011316251B2

(12) United States Patent
Choi et al.

(10) Patent No.: US 11,316,251 B2
(45) Date of Patent: Apr. 26, 2022

(54) RADIO FREQUENCY PACKAGE

(71) Applicant: SAMSUNG ELECTRO-MECHANICS CO., LTD., Suwon-si (KR)

(72) Inventors: Jae Woong Choi, Suwon-si (KR); Jin Won Lee, Suwon-si (KR); Hae Kyo Seo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/109,619

(22) Filed: Dec. 2, 2020

(65) Prior Publication Data

US 2022/0013882 A1 Jan. 13, 2022

(30) Foreign Application Priority Data

Jul. 8, 2020 (KR) ........................ 10-2020-0083974

(51) Int. Cl.
*H03M 1/24* (2006.01)
*H01Q 1/22* (2006.01)
*H01Q 9/04* (2006.01)
*H01Q 1/24* (2006.01)

(52) U.S. Cl.
CPC ........... *H01Q 1/2283* (2013.01); *H01Q 1/243* (2013.01); *H01Q 9/0414* (2013.01)

(58) Field of Classification Search
CPC .... H01Q 1/2283; H01Q 1/243; H01Q 9/0414; H01Q 9/0407
USPC .......................................................... 343/893
See application file for complete search history.

(56) References Cited

U.S. PATENT DOCUMENTS

| | | | | |
|---|---|---|---|---|
| 11,211,710 | B2 * | 12/2021 | Kitamura | H01Q 21/061 |
| 2015/0138741 | A1 | 5/2015 | Moon et al. | |
| 2018/0337148 | A1 | 11/2018 | Baek et al. | |
| 2019/0027804 | A1 | 1/2019 | Kim et al. | |

FOREIGN PATENT DOCUMENTS

| | | | |
|---|---|---|---|
| KR | 10-2018-0127144 | A | 11/2018 |
| KR | 10-2019-0009232 | A | 1/2019 |
| KR | 10-2019-0104978 | A | 9/2019 |
| KR | 10-2052761 | B1 | 12/2019 |

* cited by examiner

*Primary Examiner* — Peguy Jean Pierre
(74) *Attorney, Agent, or Firm* — Morgan, Lewis & Bockius LLP

(57) ABSTRACT

A radio frequency package includes a first connection member having a first stack structure including at least one first insulating layer and at least one first wiring layer; a second connection member having a second stack structure including at least one second insulating layer and at least one second wiring layer; a core member including a core insulating layer and disposed between the first and second connection members; and a first chip antenna disposed to be surrounded by the core insulating layer. The first chip antenna includes a first dielectric layer disposed to be surrounded by the core insulating layer; a patch antenna pattern disposed on an upper surface of the first dielectric layer; and a feed via disposed to at least partially penetrate the first dielectric layer, providing a feed path of the patch antenna pattern and connected to the at least one first wiring layer.

31 Claims, 13 Drawing Sheets

RADIO FREQUENCY PACKAGE

CROSS-REFERENCE TO RELATED APPLICATION

This application claims the benefit under 35 U.S.C. § 119(a) of Korean Patent Application No. 10-2020-0083974 filed on Jul. 8, 2020, in the Korean Intellectual Property Office, the entire disclosure of which is incorporated herein by reference for all purposes.

TECHNICAL FIELD

The present disclosure relates to a radio frequency package.

BACKGROUND

Mobile communications data traffic has increased on an annual basis. Various techniques have been actively developed to support rapidly increasing data transmissions in wireless networks in real time. For example, conversion of Internet of Things (IoT)-based data into contents, augmented reality (AR), virtual reality (VR), live VR/AR linked with SNS, an automatic driving function, applications such as a sync view (transmission of real-time images from a user's viewpoint using a compact camera), and the like, may require communications (e.g., 5G communications, mmWave communications, and the like) which support the transmission and reception of large volumes of data.

Accordingly, there has been a large amount of research into mmWave communications including 5th generation (5G), and research into the commercialization and standardization of an antenna apparatus for implementing such communications has been increasingly conducted.

An RF signal within a high frequency band (e.g., 24 GHz, 28 GHz, 36 GHz, 39 GHz, 60 GHz, and the like) may be easily absorbed and lost while being transferred, such that communications quality may be degraded. Thus, an antenna for communications, based on a high frequency band, may need a technical approach different from that of a general antenna technique, and development of a special technique such as securing of antenna gain, integration between an antenna and an RFIC, securing of effective isotropic radiated power (EIRP), and the like, may be required.

SUMMARY

The present disclosure relates to a radio frequency package.

According to an aspect of the present disclosure, a radio frequency package may include a first connection member having a first stack structure in which at least one first insulating layer and at least one first wiring layer are alternately stacked; a second connection member having a second stack structure in which at least one second insulating layer and at least one second wiring layer are alternately stacked; a core member including a core insulating layer and disposed between the first and second connection members; and a first chip antenna disposed to be surrounded by the core insulating layer. The first chip antenna may include a first dielectric layer disposed to be surrounded by the core insulating layer; a patch antenna pattern disposed on an upper surface of the first dielectric layer; and a feed via disposed to at least partially penetrate the first dielectric layer in a thickness direction of the radio frequency package, providing a feed path of the patch antenna pattern and connected to the at least one first wiring layer.

According to an aspect of the present disclosure, a radio frequency package may include a core member including a core insulating layer in which a core via is disposed, and having a cavity penetrating at least a portion of the core insulating layer; a chip antenna disposed in the cavity, wherein the chip antenna includes a dielectric layer, a patch antenna pattern disposed on an upper surface of the dielectric layer, and a feed via penetrating the first dielectric layer and providing a feed path of the patch antenna pattern; and a connection member disposed on one side of the core member and including a wiring layer connected to the core via and the feed via.

According to an aspect of the present disclosure, a radio frequency package may include a core member including a core insulating layer and having a cavity penetrating at least a portion of the core insulating layer; a chip antenna disposed in the cavity, wherein the chip antenna includes a dielectric layer, a patch antenna pattern disposed on an upper surface of the dielectric layer, and a feed via penetrating the first dielectric layer and providing a feed path of the patch antenna pattern; an insulating member covering the core member and the chip antenna and disposed in at least a portion of the cavity; and a connection member including a wiring layer disposed on the insulating member. The wiring layer includes a coupling patch pattern overlapping the patch antenna pattern.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Further, descriptions of features that are known in the art may be omitted for increased clarity and conciseness. Accordingly, the features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Hereinbelow, the example embodiments of the present disclosure will be described in detail with reference to the accompanying drawings, such that one of ordinary skill in the art could easily practice the invention.

Figure 1A:
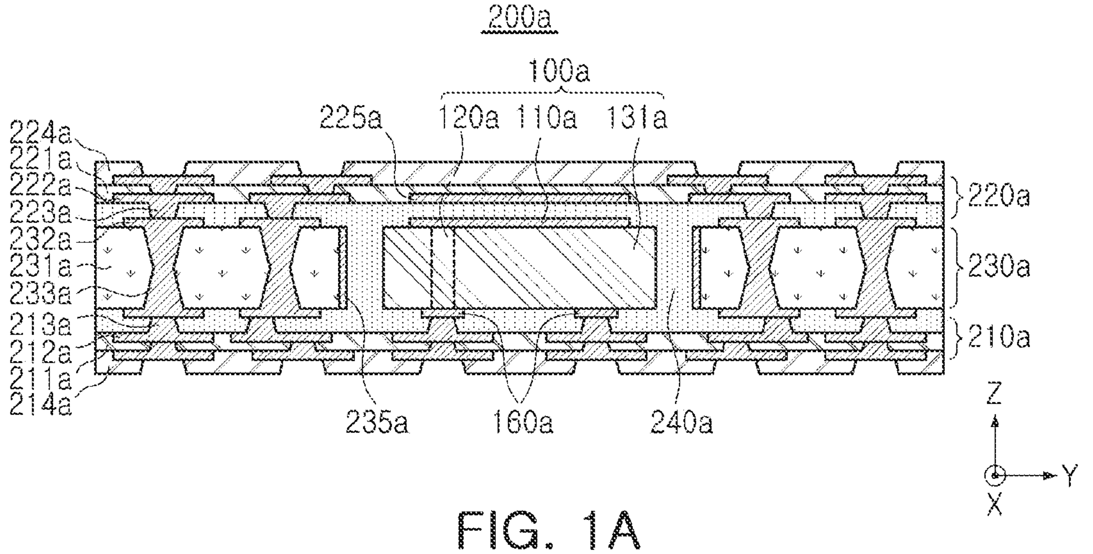
FIGS. 1A to 1C are diagrams illustrating a radio frequency package according to an example embodiment.
Figure 1B:
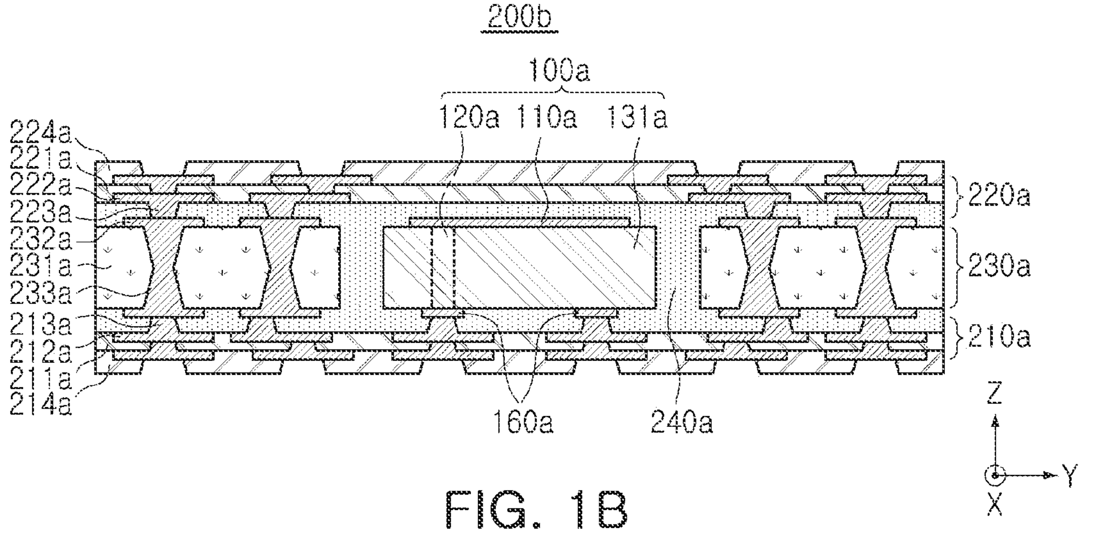
Figure 1C:
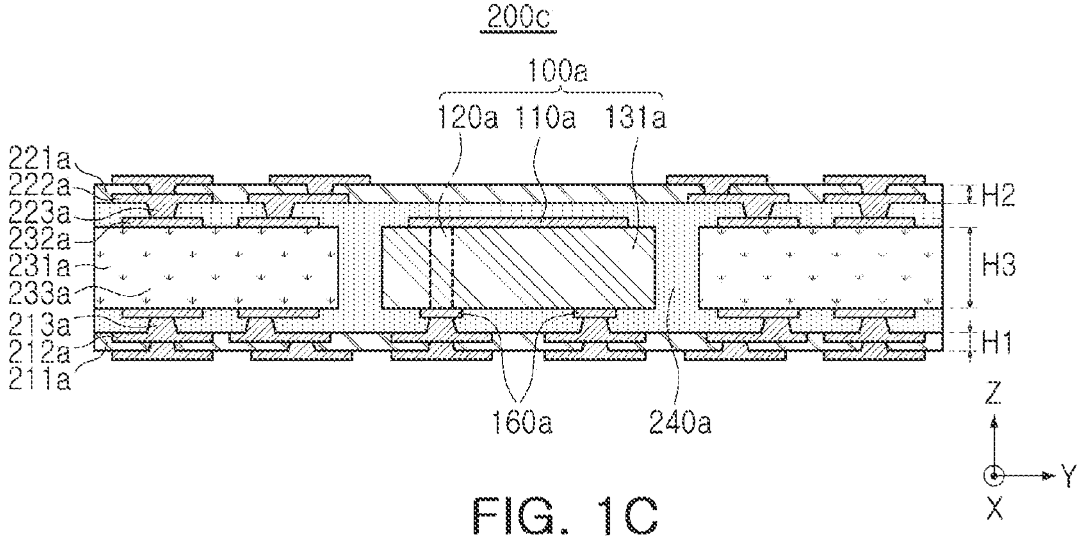

FIGS. 1A to 1C are diagrams illustrating a radio frequency package according to an example embodiment.

Referring to FIG. 1A, a radio frequency package 200*a*, according to an example embodiment, may have a structure in which a first chip antenna 100*a* is disposed, and the first chip antenna 100*a* may include a first dielectric layer 131*a*, a patch antenna pattern 110*a* and a feed via 120*a*.

The first dielectric layer 131*a* may have a dielectric medium having a higher dielectric constant than air. For example, the first dielectric layer 131*a* may be formed of ceramic and may thus have a comparatively high dielectric constant.

The first chip antenna 100*a* may be manufactured separately from the remaining structure of the radio frequency package 200*a* and is disposed in the radio frequency package 200*a*. In this regard, the first dielectric layer 131*a* may be formed of a material different from a material (e.g., prepreg) of an insulating layer of the radio frequency package 200*a* and may be implemented in a method selected among various and released methods as compared to the insulating layer.

In this regard, the first chip antenna 100*a* may have further improved antenna performance (e.g., gain, bandwidth, maximum output and polarization efficiency) for a size thereof, as compared to an antenna based on a structure in which an insulating layer and a wiring layer of a connection member are stacked.

For example, the first dielectric layer 131*a* may be formed of a ceramic-based material, such as low temperature co-fired ceramic (LTCC), a glass-based material having a comparatively high dielectric constant or a material, such as Teflon, having a comparatively low dissipation factor. Alternately, the first dielectric layer 131*a* may be configured to have a higher dielectric constant or greater durability by containing at least one of magnesium (Mg), silicon (Si), aluminum (Al), calcium (Ca) or titanium (Ti). For example, the first dielectric layer 131*a* may contain $Mg_2SiO_4$, $MgAlO_4$ or $CaTiO_3$.

As the first dielectric layer 131*a* has a higher dielectric constant, a wavelength of a radio frequency transmitted or propagated may be reduced. The shorter the wavelength of an RF signal is, the smaller the size of the first dielectric layer 131*a* is. A size of the first chip antenna 100*a*, according to an example embodiment, may be reduced. The lower the dissipation factor of the first dielectric layer 131*a* is, the smaller the energy loss of the RF signal is in the first dielectric layer 131*a*.

As the size of the first chip antenna 100*a* is reduced, the number of the first chip antenna 100*a* arrangeable in a unit volume may increase. As the number of the first chip antenna 100*a* arrangeable in a unit volume increases, a total gain or a maximum output of a plurality of the first chip antennas 100*a* may increase.

Accordingly, as the first dielectric layer 131*a* has a higher dielectric constant, performance of the first chip antenna 100*a* may effectively increase for a size thereof.

The patch antenna pattern 110*a* may be disposed on an upper surface of the first dielectric layer 131*a*. A comparatively large upper surface of the patch antenna pattern 110*a* may allow a radiation pattern to be concentrated in a vertical direction (e.g., z direction) and can thus remotely transmit and/or receive an RF signal in a vertical direction. Further, an RF signal having a frequency (e.g., 24 GHz, 28 GHz, 36 GHz, 39 GHz, 60 GHz) within a bandwidth based on a resonance frequency may be transmitted and/or received.

For example, the patch antenna pattern 110*a* may be formed by drying a conductive paste while being applied and/or charged on the first dielectric layer 131*a*.

The feed via 120*a* may be disposed to at least partially penetrate the first dielectric layer 131*a* in a thickness direction and may also function as a feed path of the patch antenna pattern 110*a*. That is, the feed via 120*a* may provide a path for a surface current flowing in the patch antenna pattern 110*a* when the patch antenna pattern 110*a* remotely transmits and/or receives an RF signal.

For example, the feed via 120*a* may have a structure which extends in a vertical direction within the first dielectric layer 131*a* and may be formed through a process in which a conductive material (e.g., copper, nickel, tin, silver, gold, palladium, and the like) is filled in a through hole formed in the first dielectric layer 131*a* by a laser.

For example, the feed via 120*a* may be in contact with one point of the patch antenna pattern 110*a*, and may also provide a feed path to the patch antenna pattern 110 without being in contact with the patch antenna pattern 110*a* depending on a design.

Referring to FIG. 1A, a radio frequency package 200*a*, according to an example embodiment, may include a first connection member 210*a*, a second connection member 220*a* and a core member 230*a*.

The first connection member 210*a* may have a first stack structure in which at least one first insulating layer 211*a* and at least one first wiring layer 212*a* are alternately stacked. For example, the first connection member 210*a* may include a first via 213*a* extending in a direction perpendicular to the first insulating layer 211*a* and may further include a first SR (solder resist) layer 214*a*.

For example, the first connection member 210*a* may have a structure of being built up downwardly of the core member 230*a*. Accordingly, the first via 213*a* which may be included in the first connection member 210*a* may have a structure in which a lower portion has a greater width than an upper portion.

The second connection member 220*a* may have a second stack structure in which at least one second insulating layer 221*a* and at least one second wiring layer 222*a* are alternately stacked. For example, the second connection member 220*a* may have a second via 223*a* extending in a direction perpendicular to the second insulating layer 221*a* and may further include a second SR layer 224*a*.

For example, the second connection member 220*a* may have a structure of being built up upwardly of the core member 230*a*. Accordingly, the second via 223*a* which may be included in the second connection member 220*a* may have a structure in which an upper portion has a greater width than a lower portion.

The at least one first wiring layer 212*a* and the at least one second wiring layer 222*a* may be formed in at least a portion of an upper surface of a lower surface of an insulating layer corresponding to include a separately designed wire and/or plane. The wire and/or plane may be electrically connected to the first via 213*a* and/or the second via 223*a*.

For example, the at least one first wiring layer 212*a*, the at least one second wiring layer 222*a*, the first via 213*a* and the second via 223*a* may be formed of a metal material (e.g., at least one conductive material of copper (Cu), aluminum (Al), silver (Ag), tin (Sn), gold (Au), nickel (Ni), lead (Pb), titanium (Ti) or alloys thereof).

For example, the at least one first insulating layer 211*a*, the at least one second insulating layer 221*a* and the core insulating layer 231*a* may be implemented as a thermosetting resin such as FR4, liquid crystal polymer (LCP), low temperature co-fired ceramic (LTCC), and an epoxy resin, a thermoplastic resin such as polyimide, a resin in which the thermosetting or thermoplastic resin is impregnated with an inorganic filler in a core material such as a glass fiber (or a glass cloth or a glass fabric), prepreg, Ajinomoto build-up film (ABF), FR-4, bismaleimide triazine (BT), a photo-imagable dielectric (PID) resin, a copper clad laminate (CCL), or a glass or ceramic-based insulating material.

The core member 230*a* may include the core insulating layer 231*a* and may be disposed between the first and second connection members 210*a* and 220*a*. For example, the core member 230*a* may include a core wiring layer 232*a* disposed on an upper surface and/or a lower surface of the core insulating layer 231*a* and may include a core via 233*a* penetrating the core insulating layer 231*a* and electrically connecting the at least one first wiring layer 212*a* and the at least one second wiring layer 222*a*.

The core insulating layer 231*a* may surround the first chip antenna 100*a*. For example, the core insulating layer 231*a* may include a through hole or a cavity, and the first chip antenna 100*a* may be surrounded by the core insulating layer 231 by being disposed inside the through hole or the cavity. The first dielectric layer 131*a* may also be surrounded by the core insulating layer 231*a*.

In this regard, the radio frequency package 200*a*, according to an example embodiment, can effectively provide a dispositional space of the first chip antenna 100*a* while employing the first chip antenna 100*a* capable of having comparatively improved antenna performance (e.g., gain, bandwidth, maximum output and polarization efficiency) for a size thereof.

For example, the radio frequency package 200*a*, according to an example embodiment, may use the first chip antenna 100*a* without using a mounting space on an upper and/or lower surface and can thus have a further reduced surface area in a horizontal direction. A larger number of components (e.g., impedance component, radio frequency filter, and the like) requiring a mounting space on an upper and/or lower surface may be used more freely.

Further, as the first and second connection members 210*a* and 220*a* can press the core insulating layer 231 therebetween and the first chip antenna 100*a* together, the radio frequency package 200*a*, according to an example embodiment, can secure structural stability (e.g., frequency of warpage occurrence, strength) while employing the first chip antenna 100*a*.

In addition, the first chip antenna 100*a* can be electrically connected to the first wiring layer 212*a* without a solder having an unstable shape and a relatively low melting point. In this regard, energy loss of a remotely transmitted/received RF signal when passing between the first connection member 210*a* and the first chip antenna 100*a* may be reduced.

For example, the first chip antenna 100*a* may further include an electrical connection structure 160*a* connecting the feed via 120*a* and the at least one first wiring layer 212*a* on the first connection member 210*a*.

The electrical connection structure 160*a* may be formed of the same material (e.g., copper) as the at least one first wiring layer 212*a* and may be disposed before the first chip antenna 100*a* is built in the radio frequency package 200*a* and can thus have a more stable shape. Accordingly, the RF signal, which is remotely transmitted/received, may have further reduced energy loss when passing between the first connection member 210*a* and the first chip antenna 100*a*.

Referring to FIG. 1A, the at least one second wiring layer 222*a* may include a coupling patch pattern 225*a* disposed to overlap the patch antenna pattern 110 in a vertical direction. In one example, the vertical direction may refer to a direction in which insulating layers and wiring layers are stacked.

The coupling patch pattern 225*a* may be electromagnetically coupled with the patch antenna pattern 110*a* and may provide an additional resonance frequency to the patch antenna pattern 110*a*. Accordingly, the patch antenna pattern 110*a* may have a further greater bandwidth.

As the coupling patch pattern 225*a* is spaced apparat from the first chip antenna 100*a* and is disposed in the second connection member 220*a*, the first chip antenna 100*a* may have an extended bandwidth based on the coupling patch pattern 225*a* without having an increased thickness thereof in the vertical direction.

Referring to FIG. 1A, the core member 230*a* may further include a plating member 235*a* such as a metal layer disposed on a side surface facing the first chip antenna 100*a* in the core insulating layer 231*a*.

As the plating member 235*a* can reflect a horizontal component, among horizontal and vertical components included in a radiated RF signal, a radiation pattern of the first chip antenna 100*a* may be further concentrated in the vertical direction (e.g., z direction), and gain of the first chip antenna 100*a* may be further improved.

For example, the plating member 235*a* may be formed after a through hole or a cavity is formed in the core insulating layer 231*a* and before the first chip antenna 100*a* is disposed.

Referring to FIG. 1A, the core member 230*a* may further include an insulating member 240*a* disposed to fill at least a portion of the space (e.g., through hole, cavity) surrounded by the core insulating layer 231*a*.

In this regard, structural stability of the core member 230*a* may be further improved, and accordingly, the radio frequency package 200*a*, according to an example embodiment, can secure structural stability (e.g., frequency of warpage occurrence, strength) while employing the first chip antenna 100*a*.

Further, the insulating member 240*a* can support build-up of the first and second connection members 210*a* and 220*a* and can thus support structural stability thereof.

Referring to FIG. 1B, a radio frequency package 200*b* according to an example embodiment may have a structure in which the coupling patch pattern 225*a* and/or the plating member 235*a* illustrated in FIG. 1A are omitted and can effectively provide a dispositional space of the first chip antenna 100*a* while employing the first chip antenna 100*a* capable of comparatively having further improved antenna performance for a size thereof.

Referring to FIG. 1C, a radio frequency package 200*c* according to an example embodiment may have a structure in which the core via 233*a* illustrated in FIG. 1B is further omitted.

Meanwhile, a thickness H3 of the core insulating layer 231*a* may be greater than a thickness H1 of the at least one first insulating layer and a thickness H2 of the at least one second insulating layer. Accordingly, the radio frequency package 200*c* according to an example embodiment can have further improved structural stability (e.g., frequency of warpage occurrence, strength) while employing the first chip antenna 100*a*.

FIGS. 2A to 2D are diagrams illustrating various structures of a chip antenna of a radio frequency package according to an example embodiment.

Figure 2A:
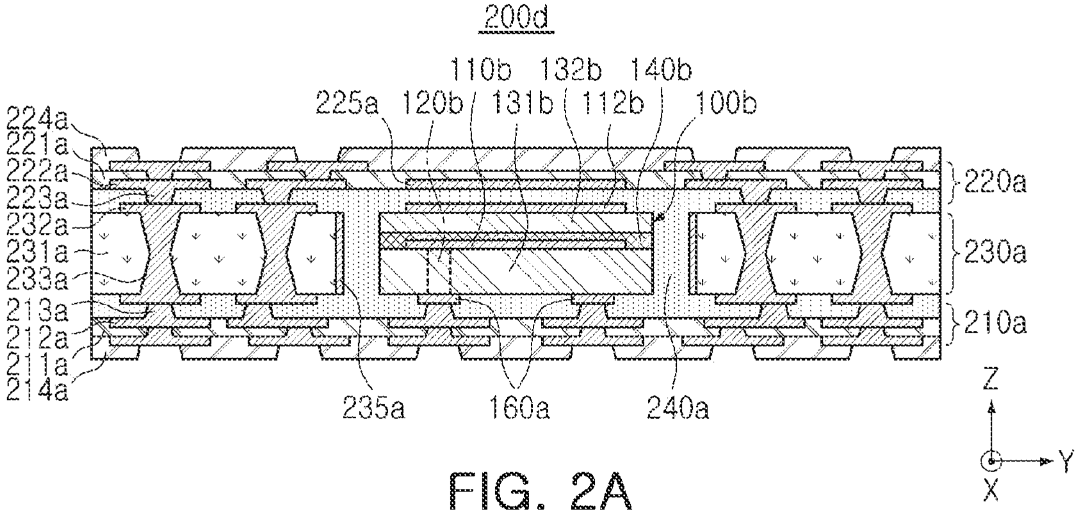
FIGS. 2A to 2D are diagrams illustrating various structures of a chip antenna of a radio frequency package according to an example embodiment.

Referring to FIG. 2A, a first chip antenna 100*d* of a radio frequency package 200*d* according to an example embodiment may further include at least one of a second dielectric layer 132*b*, an adhesive layer 140*b* and an upper patch pattern 112*b*.

The second dielectric layer 132*b* may be disposed on an upper surface of a patch antenna pattern 110*b* and may be surrounded by a core insulating layer 231*a*. For example, the second dielectric layer 132*b* may be implemented in the same manner as the first dielectric layer 131*b* and may be formed of the same material.

The second dielectric layer 132*b* may be formed of a material different from that of the core insulating layer 231*a* of the radio frequency package 200*d* and may be implemented in a manner selected among various and free manners as compared to the core insulating layer 231*a*.

For example, the second dielectric layer 132*b* may act as a dielectric medium having a relatively high dielectric constant or a relatively low dissipation factor and can further concentrate a radiation pattern of the patch antenna pattern 131*b* in a vertical direction (e.g., z direction). The second dielectric layer 132*b* may further increase gain of the patch antenna pattern 131*b*.

The adhesive layer 140*b* may be disposed between first and second dielectric layers 131*b* and 132*b* and may have stronger adhesion as compared to the first and second dielectric layers 131*b* and 132*b*. For example, the adhesive layer 140*b* may be formed of an adhesive polymer.

In this regard, a positional relationship between the first and second dielectric layers 131*b* and 132*b* may be fixed more stably, and accordingly, a dielectric medium boundary condition of the first and second dielectric layers 131*b* and 132*b* can more effectively concentrate the radiation pattern of the patch antenna pattern 131*b* in a vertical direction (e.g., z direction).

An upper patch pattern 112*b* may be disposed on an upper surface of the second dielectric layer 132*b* between a coupling patch pattern 225*a* and the patch antenna pattern 110*b*.

For example, the upper patch pattern 112*b* may be electromagnetically coupled to the patch antenna pattern 110*b* and may provide an additional resonance frequency to the patch antenna pattern 110. In this regard, the patch antenna pattern 110*b* may have a further greater bandwidth.

For example, the upper patch pattern 112*b* may have a horizontal size different from that of the patch antenna pattern 110*b* and may have a second bandwidth, not overlapping a first bandwidth of the patch antenna pattern 110*b*.

In this regard, the first chip antenna 100*b* may have a plurality of frequency bandwidths and may transmit and/or receive first and second RF signals having different fundamental frequencies.

Figure 2B:
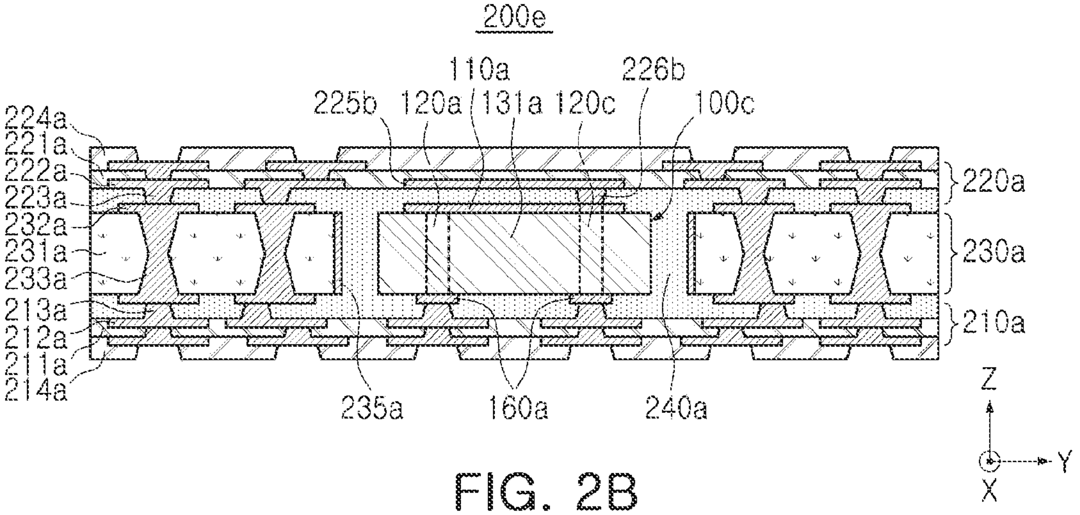

Referring to FIG. 2B, a first chip antenna 100*c* of a radio frequency 200*e* according to an example embodiment may include a feed via 120*a* providing a feed path of a first RF signal and a feed via 120*c* providing a feed path of a second RF signal.

The radio frequency 200*e* may further include a connection via 226*b* electrically connecting a coupling patch pattern 225*b* and a first chip antenna 100*c*.

For example, the connection via 226*b* may provide the feed path of the second RF signal to the coupling patch pattern 225*b* and may be electrically connected to the feed via 120*c*.

A structure in which the connection via 226*b* and the feed via 120*c* are connected may penetrate the patch antenna pattern 110*a* and may not be in contact with the patch antenna pattern 110*a*.

Figure 2C:
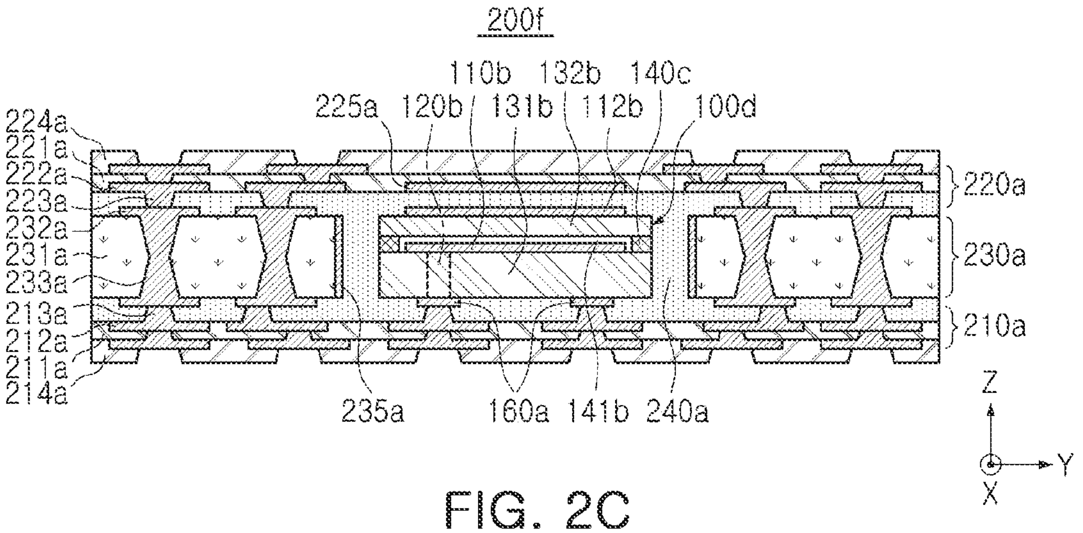

Referring to FIG. 2C, an adhesive layer 140*c* of a first chip antenna 100*d* of a radio frequency 200*f* according to an example embodiment may have an air cavity 141*b* in which the patch antenna pattern 110*b* is disposed.

The air cavity 141*b* may include air having a lower dielectric constant than the adhesive layer 140*c* and may act as a dielectric medium having a relatively low dielectric constant. In this regard, energy leaking in a horizontal direction in an electromagnetic coupling process for a coupling patch pattern 225*b* and/or an upper patch pattern 112*b* of the patch antenna pattern 110*a* may be reduced. Accordingly, antenna performance of the first chip antenna 100*d* may be further improved.

Figure 2D:
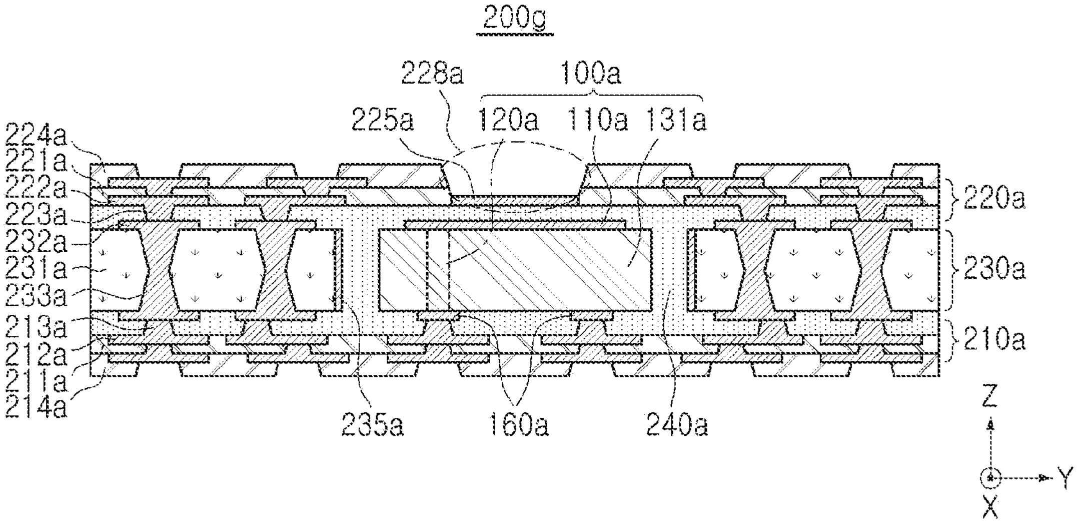

Referring to FIG. 2D, a second connection member 220*a* of a radio frequency 200*g* according to an example embodiment may have a region 228*a* overlapping at least a portion of a patch antenna pattern 110*a* in the form of an aperture.

In this regard, a dielectric medium boundary condition may be formed on a side surface of a region 228*a*. By refracting and/or reflecting a horizontal component of an RF signal remotely transmitted/received to/from the patch antenna pattern 110*a*, a radiation pattern of the patch antenna pattern 110*a* may be further concentrated in a vertical direction (e.g., z direction), and gain of the patch antenna pattern 110*a* may be further improved.

For example, a second SR layer 224*a* may have a hole formed in the region 228*a* overlapping at least a portion of the patch antenna pattern 110*a*.

In this regard, a height of the aperture of the region 228*a* of the second connection member 220*a* may be increased without an increase in a substantial thickness of the radio frequency package 200*g*. As such, the gain of the patch antenna pattern 110*a* may be further improved for the thickness of the radio frequency package 200*g*.

Figure 3A:
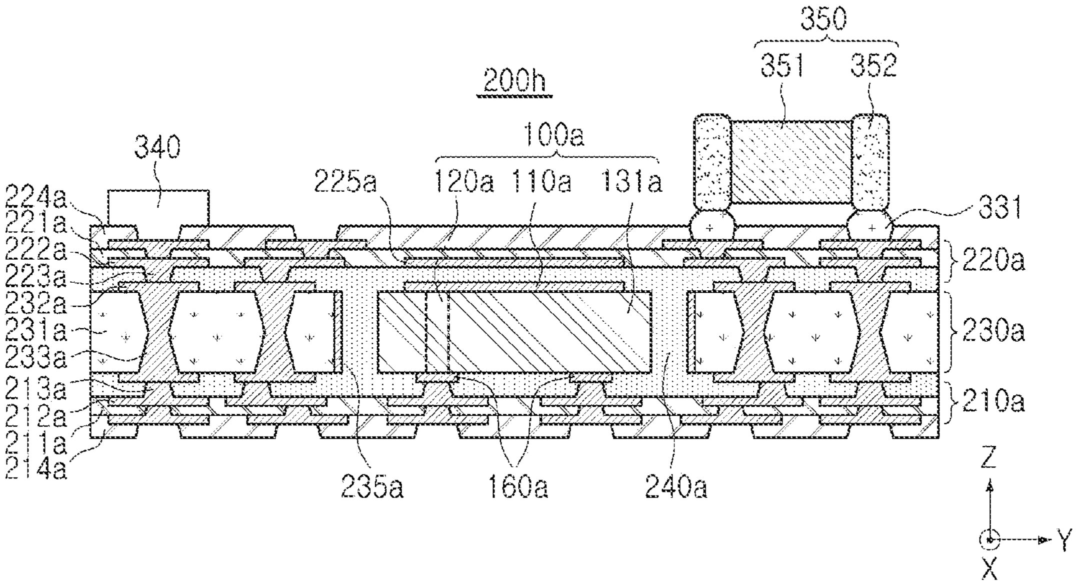
FIGS. 3A and 3B are diagrams illustrating a connection structure of a second connection member of a radio frequency package according to an example embodiment.
Figure 3B:
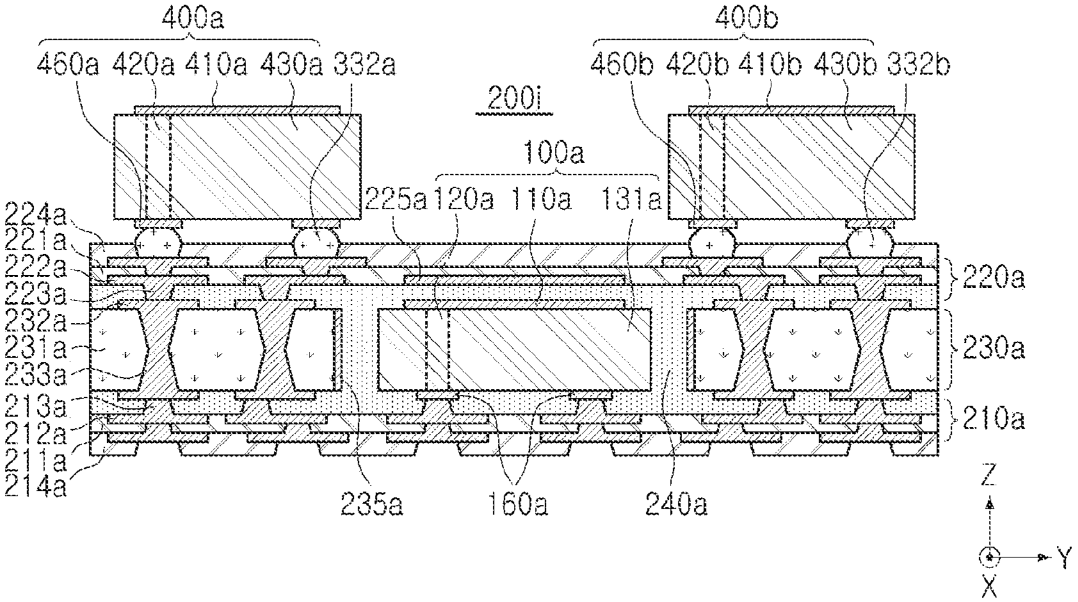

FIGS. 3A and 3B are diagrams illustrating a connection structure of a second connection member of a radio frequency package according to an example embodiment.

Referring to FIG. 3A, a radio frequency package 200*h* according to an example embodiment may further include an impedance component 350 disposed on an upper surface of a second connection member 220*a* and electrically connected to at least one second wiring layer 222*a*.

For example, the impedance component 350 may be a capacitor or an inductor and may include an impedance main body 351 forming impedance and an external electrode 352 delivering the impedance.

The external electrode 352 may be mounted on an upper surface of the second connection member 220*a* through a mounting-electrical connection structure 331. The mounting-electrical connection structure 331 may couple the second connection member 220*a* to the impedance component 350 based on a solder having a relatively low melting point and may be inserted into a predetermined location of the second SR layer 224*a*.

The impedance component 350 can deliver impedance to an outside (e.g., RFIC) through the external electrode 352 and the at least one second wiring layer 222*a* and the core via and the at least one first wiring layer 212*a*.

The radio frequency package 200*h* according to an example embodiment may further include a connector 340 disposed on an upper surface of the second connection member 220*a* and electrically connected to the at least one second wiring layer 222*a*.

The connector 340 may provide an electric path of a base signal of a frequency lower than that of an RF signal remotely transmitted/received through the first chi antenna 100*a*. The base signal can be delivered to an outside (e.g., RFIC) through the connector 340 and the at least one second wiring layer 222*a* and the core via 233*a* and the at least one first wiring layer 212*a*. The base signal may also be converted into an RF signal in the outside (e.g., RFIC), and the RF signal may be delivered to the first chip antenna 100*a* through the at least one first wiring layer 212*a* to be radiated.

For example, the connector 340 may have a structure in which a coaxial cable is physically connected thereto, but is not limited thereto.

Referring to FIG. 3B, a radio frequency package 200*i* according to an example embodiment may further include second chip antennas 400*a* and 400*b* disposed on an upper surface of the second connection member 220*a* and electrically connected to the at least one second wiring layer 222*a*.

The second chip antenna 400*a* may include at least a portion of a patch antenna pattern 410*a*, a feed via 420*a*, a dielectric layer 430*a* and an electrical connection structure 460*a*, and the second chip antenna 400*b* may include at least a portion of a patch antenna pattern 410*b*, a feed via 420*b*, a dielectric layer 430*b* and an electrical connection structure 460*b*.

The second chip antenna 400*a* and 400*b* may be manufactured in a similar or same manner as the first chip antenna 100*a* and may be mounted on an upper surface of the second connection member 220*a* through mounting-electrical connection structures 332*a* and 332*b*. The mounting-electrical connection structures 332*a* and 332*b* may be a solder ball or a pad, but are not limited thereto.

As a radiation pattern of the first chip antenna 100*a* and those of the second chip antennas 400*a* and 400*b* may overlap each other, the radio frequency package 200*i* according to an example embodiment may possess gain and maximum output corresponding to a total number of the first chip antenna 100*a* and the second chip antennas 400*a* and 400*b*.

As the first chip antenna 100*a* is built in the radio frequency package 200*i*, the total number of the first chip antenna 100*a* and the second chip antennas 400*a* and 400*b* may increase for a size of the radio frequency package 200*i*.

Accordingly, the radio frequency package 200*i* according to an example embodiment may have gain and large maximum output improved for the size thereof.

For example, sizes of the patch antenna patterns 410*a* and 410*b* of the second chip antennas 400*a* and 400*b* and that of the patch antenna pattern 110*a* of the first chip antenna 100*a* may be different from each other. For example, dielectric constants of the dielectric layers 430*a* and 430*b* of the second chip antennas 400*a* and 400*b* and that of the first dielectric layer 131*a* of the first chip antenna 100*a* may be different from each other.

That is, a first frequency bandwidth of the first chip antenna 100*a* and a second frequency bandwidth of the second chip antennas 400*a* and 400*b* may be different from each other, and the radio frequency package 200*i* according to an example embodiment may remotely transmit/receive first and second RF signals belonging to a plurality of frequency bandwidths which are different from each other.

As the first chip antenna 100*a* may be disposed in a lower portion than the second chip antennas 400*a* and 400*b*, electromagnetic interference therebetween may be reduced. In this regard, the radio frequency package 200*i* according to an example embodiment may improve overall gain of a plurality of different frequency bandwidths.

Furthermore, as the radio frequency package 200*i* according to an example embodiment can remotely transmit/receive the first and second RF signals belonging to a plurality of different frequency bandwidths while employing the first chip antenna 100*a* and the second chip antennas 400*a* and 400*b* implemented to be focused on a single frequency bandwidth, overall antenna performance (e.g., bandwidth, maximum output, polarization efficiency, and the like) of a plurality of different frequency bandwidths may be improved.

Figure 4A:
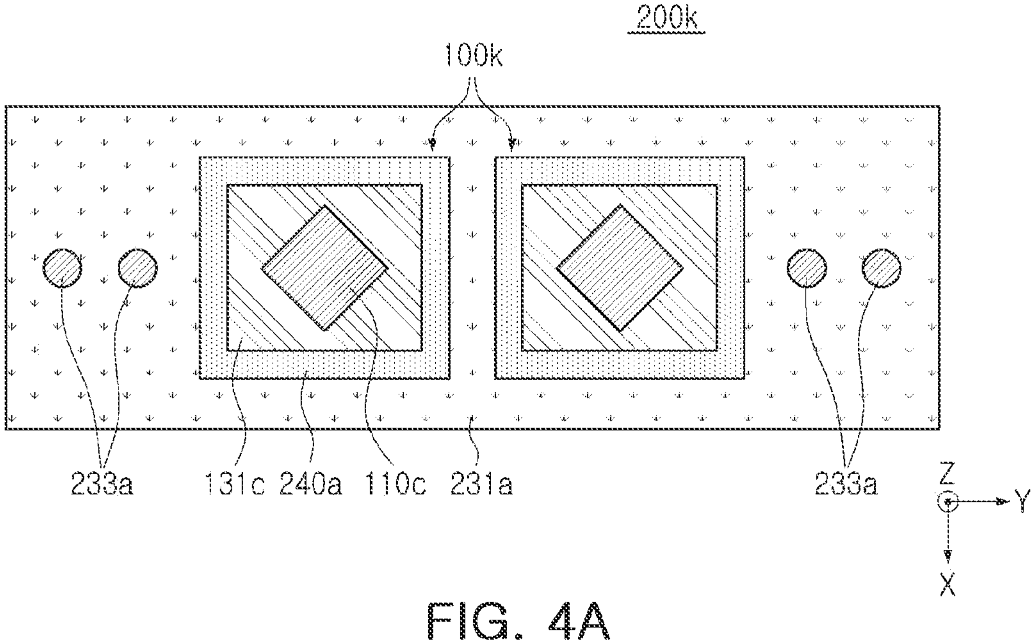
FIGS. 4A and 4B are diagrams illustrating an upper surface of a structure of a radio frequency package according to an example embodiment, in which a second connection member is omitted.
Figure 4B:
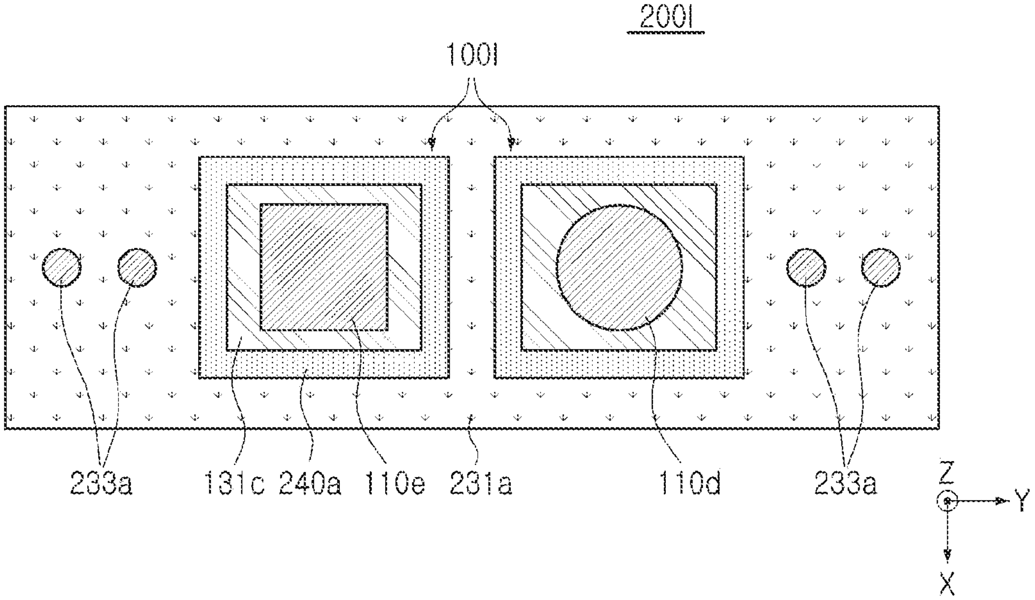

FIGS. 4A and 4B are diagrams illustrating an upper surface of a structure of a radio frequency package according to an example embodiment, in which a second connection member is omitted. The radio frequency package in FIG. 4A or FIG. 4B may correspond to one or more of the above-described radio frequency packages.

Referring to FIG. 4A, a radio frequency package 200*k* according to an example embodiment may include a plurality of first chip antennas 100*k* and may have a structure in which a plurality of the first chip antennas 100*k* are disposed in a plurality of through holes of a core insulating layer 231*a*.

For example, a patch antenna pattern 110*c*, a first dielectric layer 131*c* and a through hole may have a polygonal shape.

The patch antenna pattern 110*c* may be disposed to be oblique with respect to an external side surface of a variant core insulating layer 231*a* of the patch antenna pattern 110*c*. For example, the patch antenna pattern 110*c* may have a shape which is 45° rotated on an xy plane.

A surface current according to remote transmittance/receipt of an RF signal of the patch antenna pattern 110*c* may flow from one side to the other side, and an electric field corresponding to the surface current may flow in a direction the same as that of the surface current. A magnetic field corresponding to the surface current may flow in a direction perpendicular to that of the surface current.

When the patch antenna pattern 110*c* is disposed to be oblique with respect to an external side surface of a variant core insulating layer 231*a* of the patch antenna pattern 110*c*, the electric field and the magnetic field corresponding to the surface current may be formed to avoid a neighboring chip antenna and may thus have reduced electromagnetic interference provided to the neighboring chip antenna. Accordingly, overall gain of a plurality of the first chip antennas 100*k* may be improved.

Referring to FIG. 4B, a radio frequency package 200*l* according to an example embodiment may include a plurality of first chip antennas 100*l*, and a plurality of patch antenna patterns 110*d* and 110*e* of a plurality of the first chip antenna 100*l* may have a polygonal and/or circular shape.

For example, a plurality of the first chip antennas 100*l* may be manufactured by cutting a relatively large dielectric layer in a vertical direction while having a plurality of the patch antenna patterns 110*d* and 110*e* formed on the relatively large dielectric layer.

FIGS. 5A to 5F are diagrams illustrating a method for manufacturing a radio frequency package according to an example embodiment.

Figure 5A:
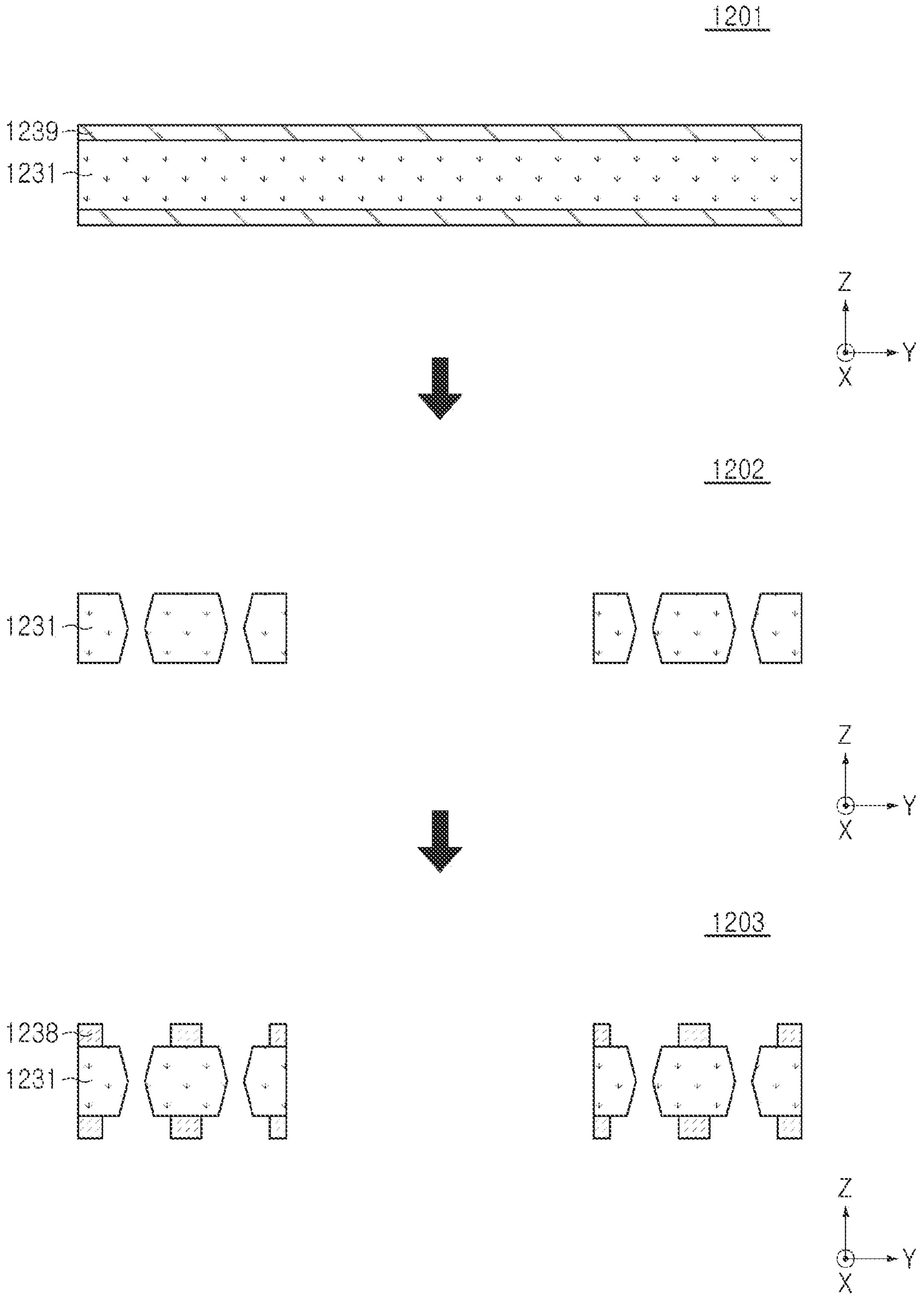
FIGS. 5A to 5F are diagrams illustrating a method for manufacturing a radio frequency package according to an example embodiment.

Referring to FIG. 5A, a radio frequency package in a first state 1201 may have a structure in which a copper clad 1239 is stacked on an upper surface and a lower surface of a core insulating layer 1231.

A radio frequency package in a second state 1202 may have a structure in which the copper clad is removed from the core insulating layer 1231 and a through hole and a via hole are formed.

A radio frequency package in a third state 1203 may have a structure in which a dry film 1238 is formed on an upper surface and a lower surface of the core insulating layer 1231.

Figure 5B:
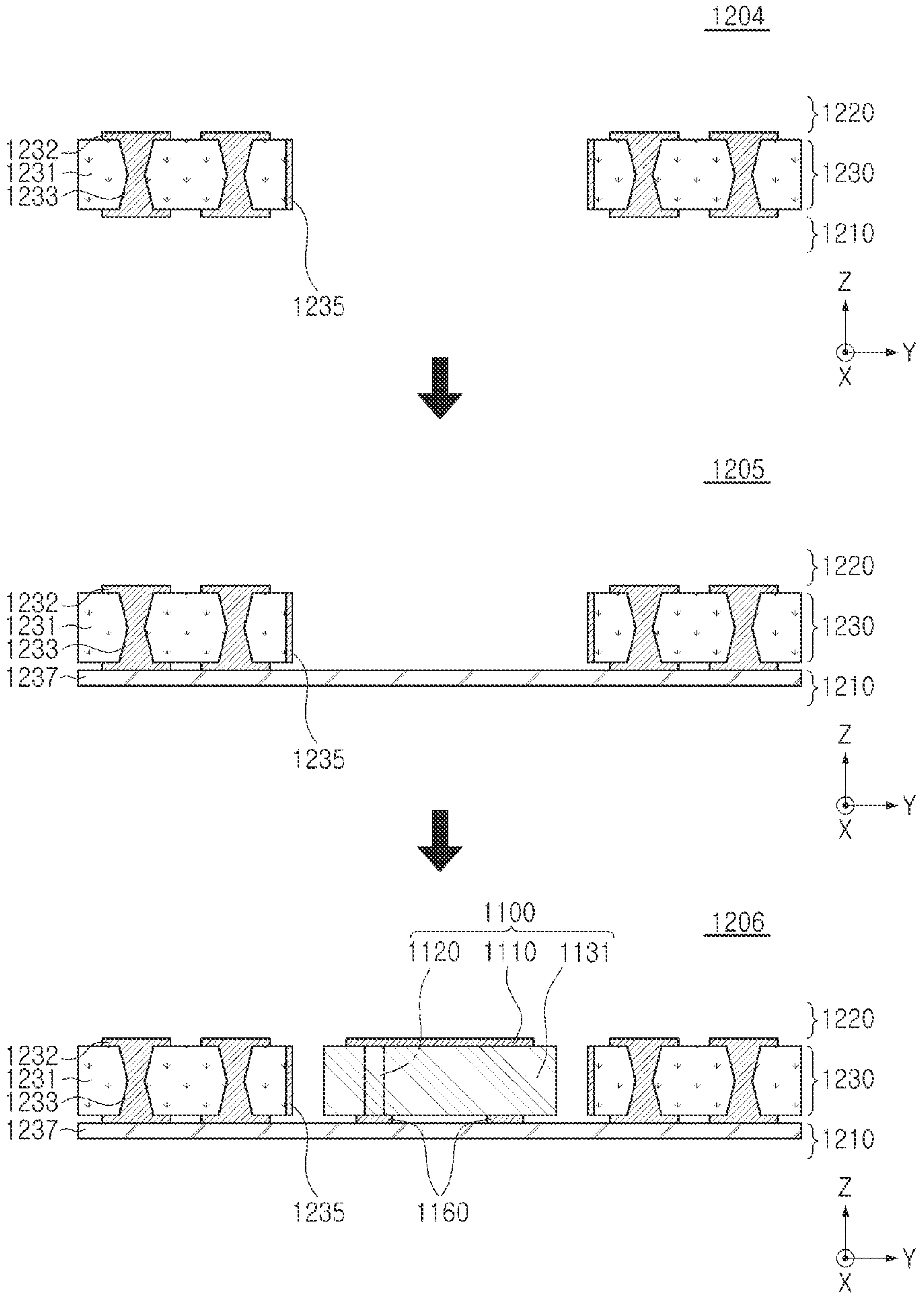

Referring to FIG. 5B, a radio frequency package in a fourth state 1204 may have a structure in which a core via 1233 is formed in the via hole of the core insulating layer 1231, a core insulating layer 1232 is formed on an upper surface and/or a lower surface of the core insulating layer 1231 and a plating member 1235 is formed on an interface of the through hole of the core insulating layer 1231. The structure corresponds to the core member 1230 and may be a supporting base for build-up of first and second connection members 1210 and 1220.

A radio frequency package in a fifth state 1205 may have a structure in which a support film 1237 is disposed on a lower surface of the core member 1230.

A radio frequency package in a sixth state 1206 may have a structure in which a first chip antenna 1100 is disposed in the through hole of the core member 1230 and may be subject to a plasma cleaning process. The first chip antenna 1100, while being coupled to a patch antenna pattern 1110, a feed via 1120, a first dielectric layer 1131 and an electrical connection structure 1160, may be disposed on an upper surface of the support film 1237.

Figure 5C:
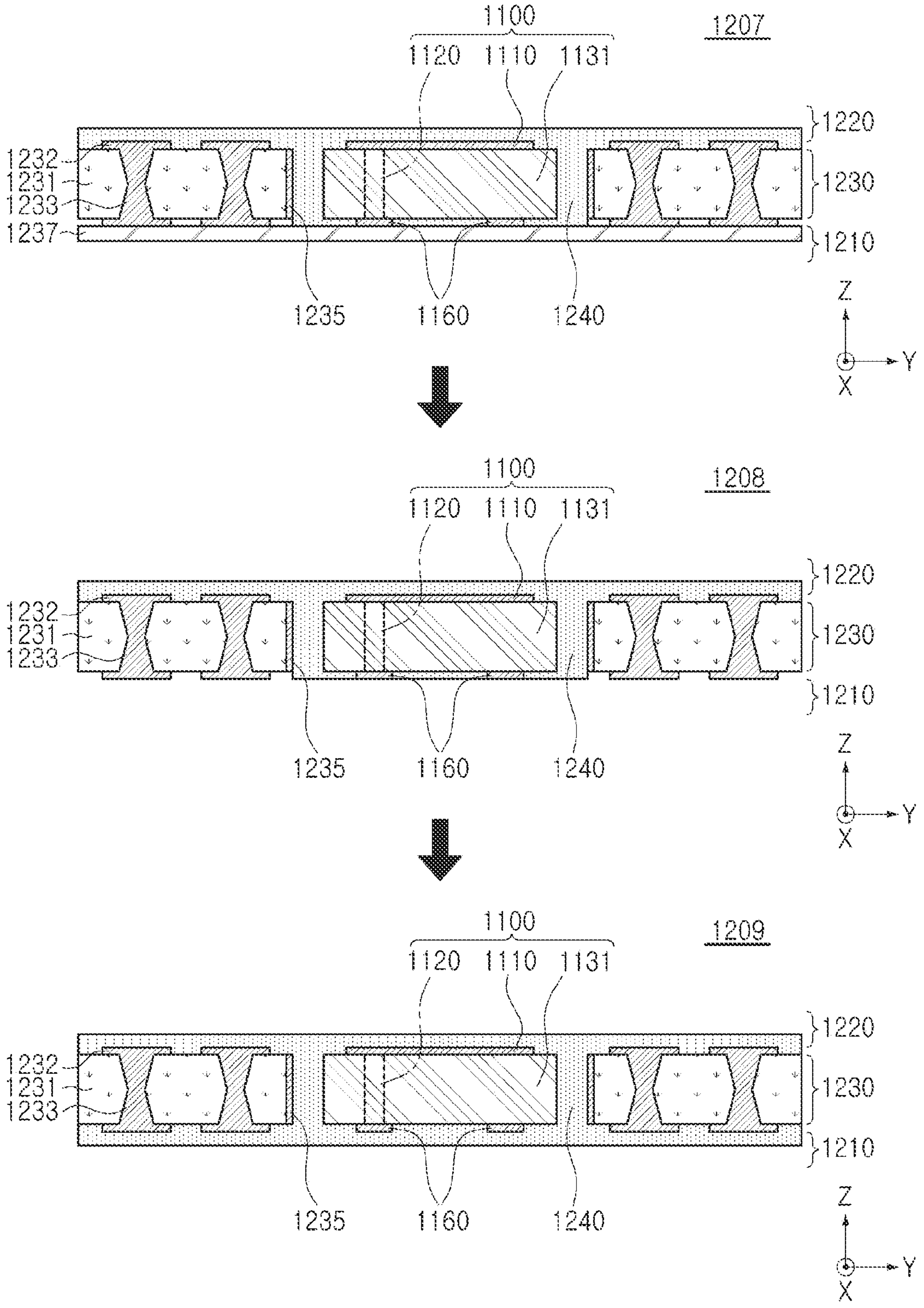

Referring to FIG. 5C, a radio frequency package in a seventh state 1207 may have a structure in which an insulating member 1240 is filled in the through hole of the core member 1230 and an upper surface of the core member 1230.

A radio frequency package in a eighth state 1208 may have a structure in which the support film 1237 is removed and may be subject to a plasma cleaning process.

A radio frequency package in a ninth state 1209 may have a structure in which the insulating member 1240 extends toward a lower surface of the core member 1230.

Figure 5D:
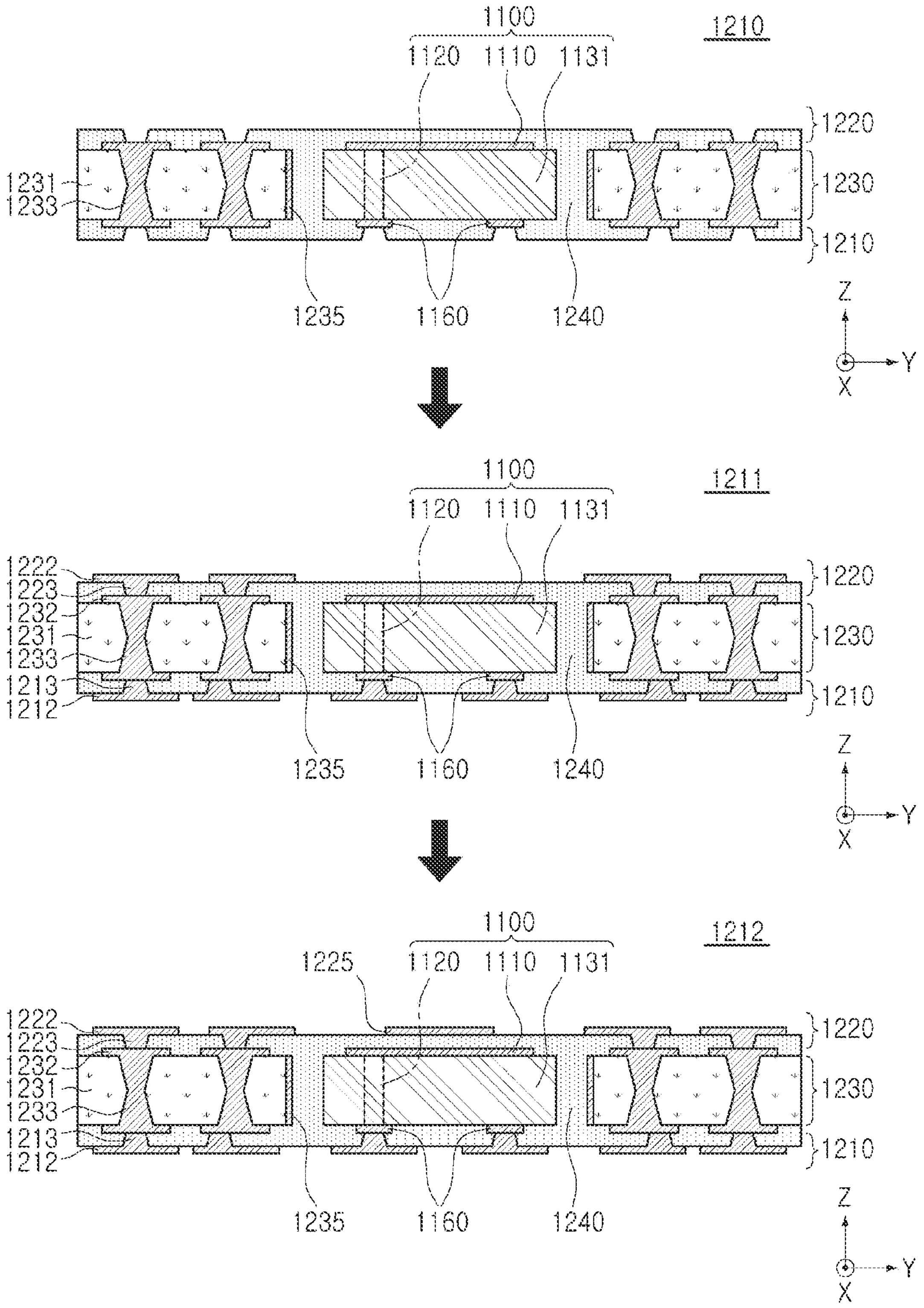

Referring to FIG. 5D, a radio frequency package in a tenth state 1210 may have a structure in which a via hole is formed on an upper surface and a lower surface of the insulating member 1240.

A radio frequency package in an eleventh state 1211 may have a structure in which first and second vias 1213 and 1223 are formed in the via hole of the insulating member 1240 and first and second wiring layers 1212 and 1222 are formed surfaces of the insulating member 1240 and may be subject to a surface treating process.

A radio frequency package in a twelfth state 1212 may have a structure in which a coupling patch pattern 1225 is formed on an upper surface of the insulating member 1240.

Figure 5E:
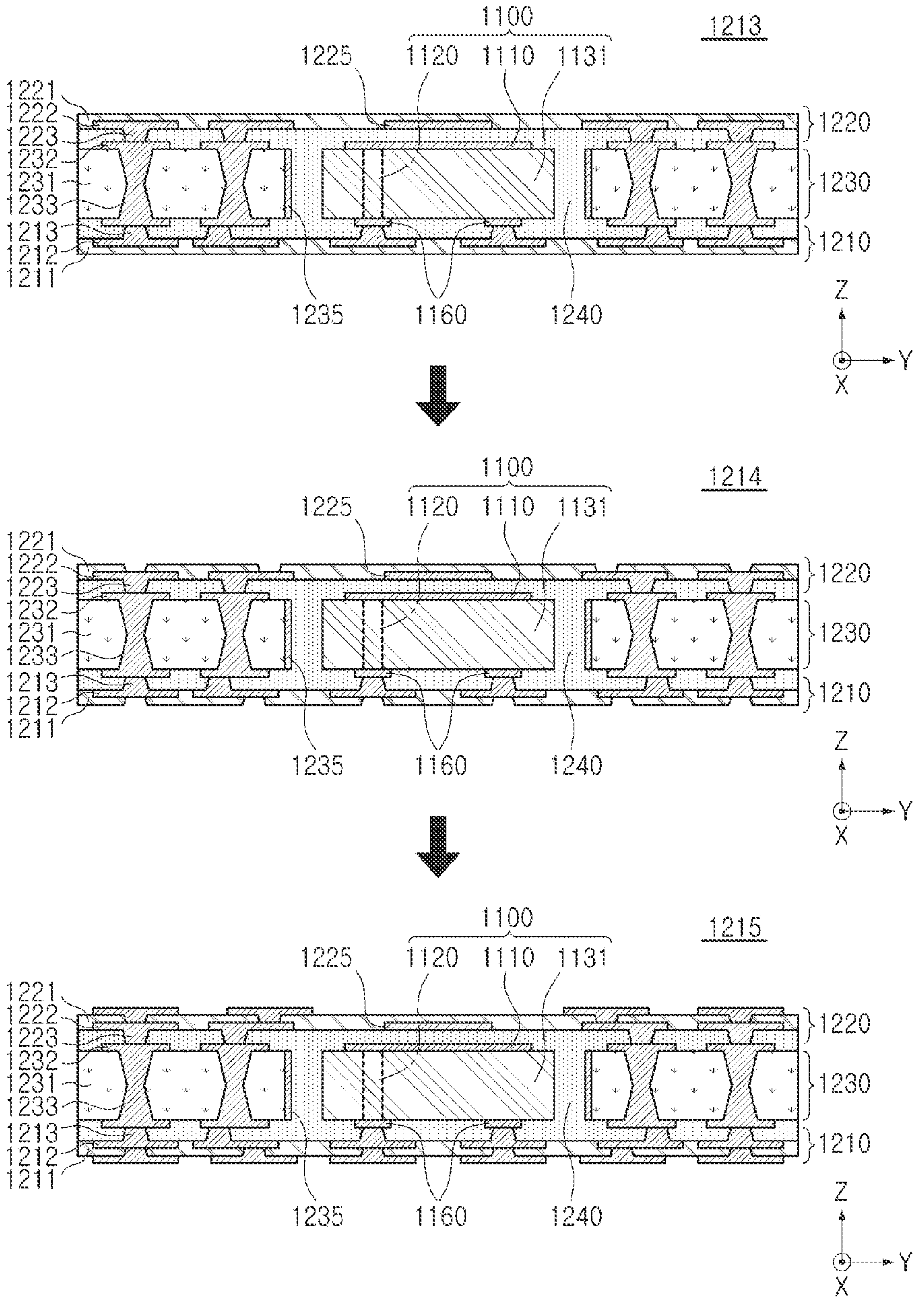

Referring to FIG. 5E, a radio frequency package in a thirteenth state 1213 may have a structure in which first and second insulating layers 1211 and 1221 are formed on an upper surface and a lower surface of the insulating member 1240.

A radio frequency package in a fourteenth state 1214 may have a structure in which a via hole is formed in the first and second insulating layers 1211 and 1221.

A radio frequency package in a fifteenth state 1215 may have a structure in which the first and second wiring layers 1212 and 1222 are formed on an upper surface and a lower surface of the first and second insulating layers 1211 and 1221.

Processes of the radio frequency packages in the thirteenth state 1213 to the fifteenth state 1215 may be repeated, and the number of the first and second insulating layers 1211 and 1221 and the first and second wiring layers 1212 and 1222, which are stacked, may be determined depending on the number of repeated processes.

Figure 5F:
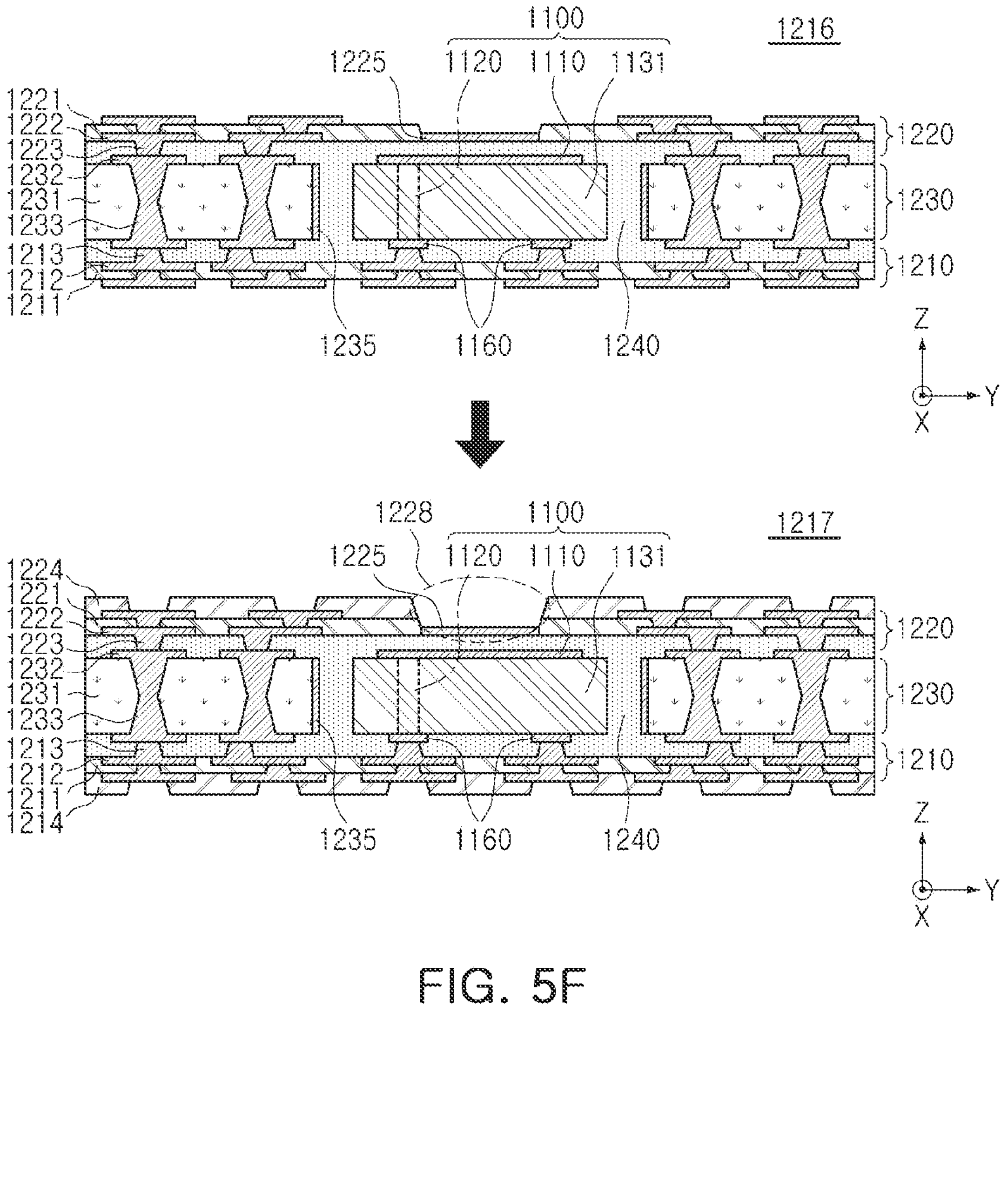

Referring to FIG. 5F, a radio frequency package in a sixteenth state 1216 may have a structure in which a portion of the second insulating layer 1221, overlapping the coupling patch pattern 1225, is removed.

A radio frequency package in a seventeenth state 1217 may have a structure in which first and second SR layers 1214 and 1224 are formed and a portion 1228 of the second SR layer 1224, overlapping the coupling patch pattern 1225, may be removed. For example, the overlapped region 1228 may be removed by a method based on microparticle collision (e.g., a sandblast method) or a method based on laser radiation.

Although reference numerals different from those shown in FIGS. 1A-4B are shown in in FIGS. 5A-5F, the structures shown in FIGS. 1A-4B may be obtained based on the method shown in FIGS. 5A-5F or may be obtained based on the method shown in FIGS. 5A-5F with some modification.

Figure 6A:
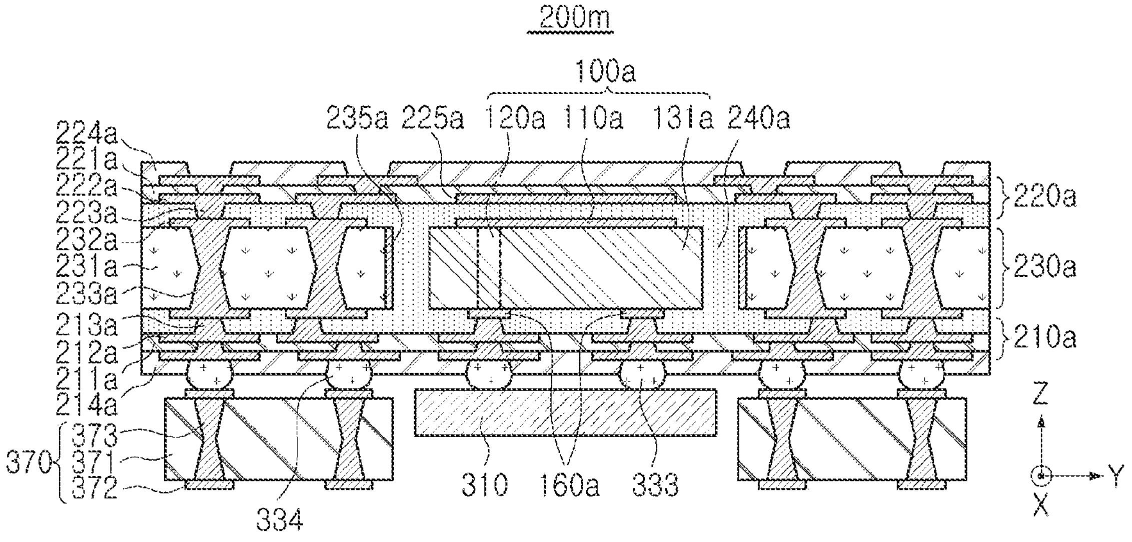
FIGS. 6A and 6B are diagrams illustrating a connection structure of a first connection member of a radio frequency package according to an example embodiment.
Figure 6B:
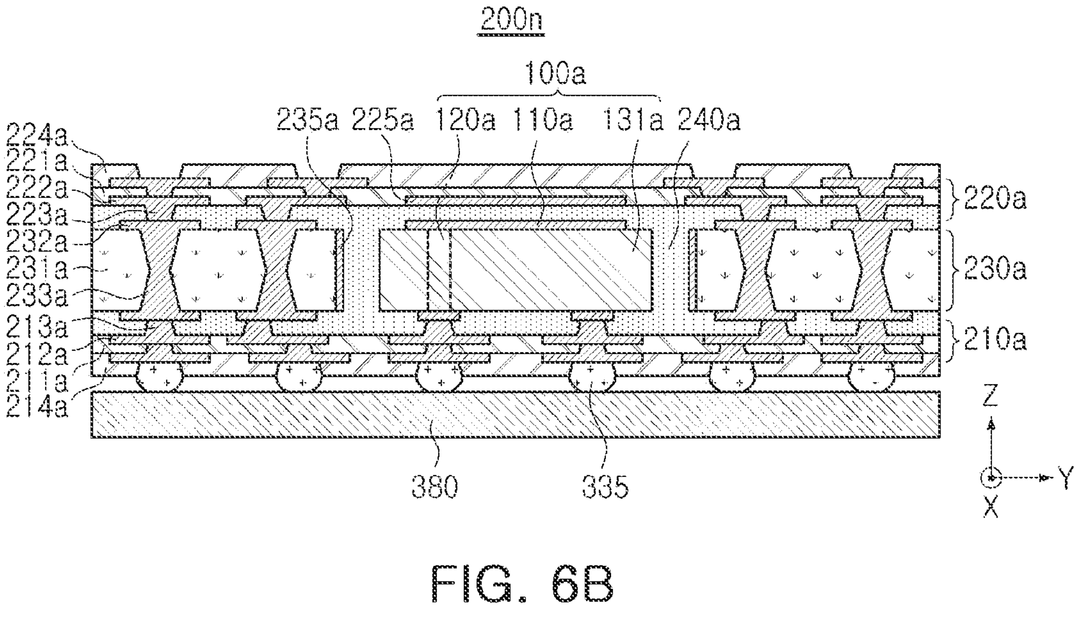

FIGS. 6A and 6B are diagrams illustrating a connection structure of a first connection member of a radio frequency package according to an example embodiment.

Referring to FIG. 6A, a radio frequency package **200*m* according to an example embodiment may further include a radio frequency integrated circuit (RFIC) 310 and a sub-substrate 370**.

The RFIC 310 may be disposed on a lower surface of a first connection member **210*a* and may be mounted via a mounting-electrical connection structure 333**.

The RFIC 310 may signal-process an RF signal remotely transmitted/received to/from a first chip antenna **100*a*** and a base signal of a frequency lower than that of the RF signal. For example, the signal-process may include frequency conversion, filtering, amplification and phase control.

The sub-substrate 370 may be disposed on a lower surface of the first connection member **210*a* and may surround the RFIC 310 and may be mounted via the mounting-electrical connection structure 334**.

For example, the sub-substrate 370 may include a sub-insulating layer 371, a sub-wring layer 372 and a sub-via 373 and may act as a path for power supply or the base signal.

For example, at least a portion of a space in which the sub-substrate 370 surrounds the RFIC 310 may be filled with an encapsulant such as photoimageable encapsulant (PIE), Ajinomoto build-up film (ABF), an epoxy molding compound (EMC), and the like.

Referring to FIG. 6B, a radio frequency package **200*n* according to an example embodiment may be mounted on a base substrate 380 via a mounting-electrical connection structure 335. The base substrate 380** may be a printed circuit board and may include a transfer path of a base signal.

Figure 7:
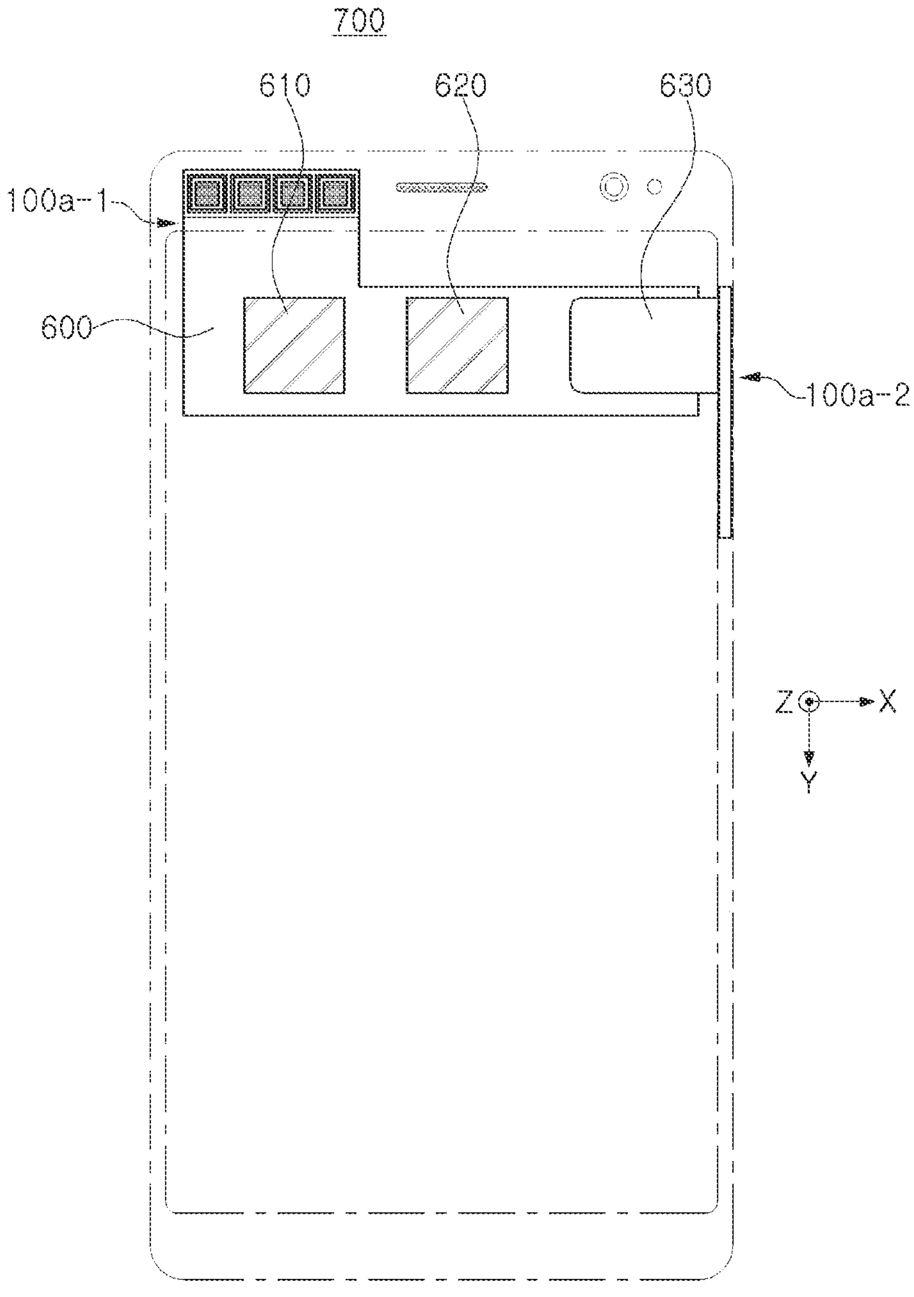
FIG. 7 is a planar view exemplifying a disposition of a substrate in an electronic device, in which a chip antenna according to an example embodiment is disposed.

FIG. 7 is a planar view exemplifying a disposition of a substrate in an electronic device, in which a chip antenna according to an example embodiment is disposed.

Referring to FIG. 7, radio frequency packages **100*a*-1 and 100*a*-2, which may be implemented with one or more of the above-described radio frequency packages, may be respectively disposed adjacent to different edges of an electronic device 700**.

The electronic device 700 may be a smartphone, a personal digital assistant, a digital video camera, a digital still camera, a network system, a computer, a monitor, a tablet PC, a laptop PC, a netbook PC, a television, a video game, a smart watch, an automotive component, or the like, but is not limited thereto.

The electronic device 700 may include a base substrate 600, and the base substrate 600 may further include a communication modem 610 and a baseband IC 620.

The communication modem 610 may include any one or any combination of any two or more of: a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital converter, an application-specific integrated circuit (ASIC), or the like.

The baseband IC 620 may generate a base signal by performing analog-to-digital conversion, and amplification, filtering and frequency conversion on an analog signal. Abase signal input to and output from the baseband IC 620 may be transferred to the radio frequency packages 100*a*-1 and 100*a*-2 via a coaxial cable, and the coaxial cable may be electrically connected to an electrical connection structure of the radio frequency packages 100*a*-1 and 100*a*-2.

For example, a frequency of the base signal may be a baseband and may be a frequency (e.g., several GHzs) corresponding to an intermediate frequency (IF). A frequency (e.g., 28 GHz or 39 GHz) of an RF signal may be higher than the IF and may correspond to a millimeter wave (mmWave).

The RF signals described in the example embodiments may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols, but are not limited thereto.

According to the embodiments described herein, the radio frequency package can effectively provide a dispositional space of a chip antenna while employing a chip antenna capable of having comparatively improved antenna performance (e.g., gain, bandwidth, maximum output and polarization efficiency) for a size thereof.

One element described in a particular example embodiment, even if it is not described in another example embodiment, may be understood as a description related to another example embodiment, unless an opposite or contradictory description is provided therein.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodimeents may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A radio frequency package, comprising:

a first connection member having a first stack structure in which at least one first insulating layer and at least one first wiring layer are alternately stacked;

a second connection member having a second stack structure in which at least one second insulating layer and at least one second wiring layer are alternately stacked;

a core member comprising a core insulating layer and disposed between the first and second connection members; and a first chip antenna disposed to be surrounded by the core insulating layer, wherein the first chip antenna comprises:

a first dielectric layer disposed to be surrounded by the core insulating layer;

a patch antenna pattern disposed on an upper surface of the first dielectric layer; and a feed via disposed to at least partially penetrate the first dielectric layer in a thickness direction of the radio frequency package, providing a feed path of the patch antenna pattern, and connected to the at least one first wiring layer.

2. The radio frequency package of claim 1, further comprising an electrical connection structure disposed on the first connection member to connect the feed via and the at least one first wiring layer, wherein the electrical connection structure includes substantially the same material as the at least one first wiring layer.

3. The radio frequency package of claim 1, wherein an area of the second connection member, overlapping at least a portion of the patch antenna in the thickness direction, has an aperture shape.

4. The radio frequency package of claim 1, wherein the second connection member further comprises a solder resist (SR) layer disposed on an upper surface of the second stack structure, wherein the SR layer further comprises a hole overlapping at least a portion of the patch antenna pattern in the thickness direction.

5. The radio frequency package of claim 1, wherein the at least one second wiring layer comprises a coupling patch pattern disposed to overlap the patch antenna pattern in the thickness direction.

6. The radio frequency package of claim 5, further comprising a connection via connecting the coupling patch pattern and the first chip antenna.

7. The radio frequency package of claim 1, further comprising a metal layer disposed on a side surface of the core insulating layer, facing the first chip antenna.

8. The radio frequency package of claim 1, further comprising an insulating member disposed in at least a portion of a space surrounded by the core insulating layer.

9. The radio frequency package of claim 1, wherein a thickness of the core insulating layer is greater than a thickness of one of the at least one first insulating layer and a thickness of one of the at least one second insulating layer.

10. The radio frequency package of claim 1, wherein the core member further comprises a core via penetrating the core insulating layer and connecting the at least one first wiring layer and the at least one second wiring layer.

11. The radio frequency package of claim 1, further comprising a second chip antenna disposed on an upper surface of the second connection member and connecting the at least one second wiring layer.

12. The radio frequency package of claim 11, wherein a size of a patch antenna pattern of the second chip antenna and a size of the patch antenna pattern of the first chip antenna are different from each other.

13. The radio frequency package of claim 11, wherein a dielectric layer of the second chip antenna and a dielectric layer of the first chip antenna have different dielectric constants.

14. The radio frequency package of claim 1, further comprising an impedance component disposed on an upper surface of the second connection member and connected to the at least one second wiring layer.

15. The radio frequency package of claim 1, further comprising a connector disposed on an upper surface of the second connection member and connected to the at least one second wiring layer.

16. The radio frequency package of claim 1, further comprising:

a radio frequency integrated circuit (RFIC) disposed on a lower surface of the first connection member; and a sub-substrate disposed on the lower surface of the first connection member and surrounding the RFIC.

17. The radio frequency package of claim 1, wherein the first dielectric layer has a higher dielectric constant than the core insulating layer.

18. The radio frequency package of claim 1, wherein the first chip antenna further comprises a second dielectric layer disposed on an upper surface of the patch antenna pattern and surrounded by the core insulating layer.

19. The radio frequency package of claim 18, wherein:

the at least one second wiring layer comprises a coupling patch pattern disposed to overlap the patch antenna pattern in the thickness direction, and the first chip antenna further comprises an upper patch pattern disposed on an upper surface of the second dielectric layer between the coupling patch pattern and the patch antenna pattern.

20. The radio frequency package of claim 18, wherein the first chip antenna further comprises an adhesive layer disposed between the first and second dielectric layers and having higher adhesion as compared to the first and second dielectric layers.

21. The radio frequency package of claim 20, wherein the adhesive layer has an air cavity in which the patch antenna pattern is disposed.

22. The radio frequency package of claim 1, wherein a side of the patch antenna pattern is oblique with respect to an external side surface of the core insulating layer.

23. A radio frequency package, comprising:

a core member comprising a core insulating layer in which a core via is disposed, and having a cavity penetrating at least a portion of the core insulating layer;

a chip antenna disposed in the cavity, wherein the chip antenna comprises a dielectric layer, a patch antenna pattern disposed on an upper surface of the dielectric layer, and a feed via penetrating the first dielectric layer and providing a feed path of the patch antenna pattern; and a connection member disposed on one side of the core member and including a wiring layer connected to the core via and the feed via.

24. The radio frequency package of claim 23, further comprising:

a first via extending from the wiring layer towards the core member to connect to the core via; and a second via extending from the wiring layer towards the chip antenna to connect to the feed via.

25. The radio frequency package of claim 24, further comprising a core wiring layer disposed on the core insulating layer and between the core via and the first via, and connecting the core via and the first via to each other; and an electrical connection structure disposed on the dielectric layer and between the feed via and the second via, and connecting the feed via and the second via to each other.

26. The radio frequency package of claim 23, further comprising a metal layer disposed on a side surface of the core insulating layer, facing the chip antenna.

27. The radio frequency package of claim 23, further comprising an insulating member disposed in at least a portion of the cavity.

28. A radio frequency package, comprising:

a core member comprising a core insulating layer and having a cavity penetrating at least a portion of the core insulating layer;

a chip antenna disposed in the cavity, wherein the chip antenna comprises a dielectric layer, a patch antenna pattern disposed on an upper surface of the dielectric layer, and a feed via penetrating the first dielectric layer and providing a feed path of the patch antenna pattern;

an insulating member covering the core member and the chip antenna and disposed in at least a portion of the cavity; and a connection member including a wiring layer disposed on the insulating member, wherein the wiring layer includes a coupling patch pattern overlapping the patch antenna pattern.

29. The radio frequency package of claim 28, further comprising a connection via connecting the coupling patch pattern and the chip antenna.

30. The radio frequency package of claim 28, wherein the connection member includes an aperture exposing at least a portion of the coupling patch pattern.

31. The radio frequency package of claim 28, further comprising a metal layer disposed on a side surface of the core insulating layer, facing the chip antenna.

* * * * *